United States Patent [19]

Rioult et al.

[11] 4,087,367

[45] May 2, 1978

[54] PREFERENTIAL ETCHANT FOR ALUMINIUM OXIDE

[75] Inventors: Jean-Pierre Rioult, Thaon; Raymond Fabien, Douvres-la-Delivrande, both of France

[73] Assignee: U.S. Philips Corporation, New York, N.Y.

[21] Appl. No.: 623,939

[22] Filed: Oct. 20, 1975

[30] Foreign Application Priority Data

Oct. 18, 1974 France .................. 74 35151

[51] Int. Cl.$^2$ .................. C09K 13/00; C09K 13/06; H01L 21/465

[52] U.S. Cl. .................. 252/79.1; 156/656; 156/667; 252/79.4; 427/88; 427/309

[58] Field of Search .................. 252/79.1, 79.4, 79.5; 156/17, 22, 667, 656; 427/309, 88

[56] References Cited

U.S. PATENT DOCUMENTS

| | | | |
|---|---|---|---|
| 2,867,514 | 1/1959 | Newhard | 156/22 |
| 2,883,311 | 4/1959 | Halpert | 156/22 |
| 3,479,237 | 11/1969 | Bergh | 156/17 |
| 3,634,262 | 1/1972 | Grunwald | 252/79.1 |
| 3,767,492 | 10/1973 | MacRae | 156/17 |
| 3,867,218 | 2/1975 | Henry | 156/17 |
| 3,920,471 | 11/1975 | Jones | 156/17 |
| 3,930,870 | 1/1976 | Basi | 427/309 |
| 3,932,685 | 1/1976 | Flowers | 427/88 |

FOREIGN PATENT DOCUMENTS 2,307,814  8/1973  Germany .................. 156/17

OTHER PUBLICATIONS

Chemical Abs., vol. 79, p. 284, Akira et al., "Etching Solution . . . Circuits; " No. 130635c.

Augurtyn et al., Chem. Abs., vol. 56, p. 4359(b), "Investigations on the Reaction . . . Hydrofluoride", (1961).

*Primary Examiner*—John T. Goolkasian
*Attorney, Agent, or Firm*—Frank R. Trifari

[57] ABSTRACT

A method of etching aluminium oxide and/or cleaning aluminium surfaces with an etchant consisting of a solution of a fluoride in an organic solvent, which solution is substantially free from hydrofluoric acid and unbound water.

12 Claims, No Drawings

PREFERENTIAL ETCHANT FOR ALUMINIUM OXIDE

The invention relates to a method of treating bodies with an etchant for removing aluminium oxide, to a method of manufacturing semiconductor devices which comprises a step in which a body containing a semiconductor material is subjected to a treatment with said etchant for removing aluminium oxide, and to articles, in particular semiconductor devices, manufactured while using said method.

From bodies on which aluminium oxide is provided, for example, aluminium oxide formed in situ, said aluminium oxide may be removed entirely or partly by etching. It is also possible to use an etchant of the above type for cleaning a surface or surface part where undesired aluminium oxide might possibly be present. On aluminium which is exposed in air, aluminium oxide may be formed which covers the aluminium as a thin film. Such a thin film may be annoying in further processes. For example, such a film may present difficulties in making soldered joints to the aluminium, for example, owing to a poor wetting of the surface with the solder, so that a mechanically strong joint is not obtained. If electrically conductive connections to aluminium are to be made, such a thin aluminium oxide film may prevent formation of a readily conducting junction between the aluminium and a conductor provided thereon. In order to counteract the risk of the occurrence of said drawbacks, it is desired to subject an aluminium surface previously to a treatment with an etchant for aluminium oxide, even if it is not known whether aluminium oxide is or is not present on the surface.

A known etchant for aluminium oxide is, for example, a solution of chromium oxide ($CrO_3$) and phosphoric acid ($H_3PO_4$) in water. Another known solvent for aluminium oxide is a solution of an alkali flouride in dilute sulphuric acid. However, such etchants are not very selective and the results of the etching treatment are not always reproduceable. In particular, said etchants may attack any aluminium present, which in general is undesired and will have detrimental results in particular in structures having thin aluminium layers.

Such thin aluminium layers are used in particular in semiconductor technology in which aluminium layers are used for contacting the semiconductor and for conductive connections. Furthermore, the use of layers of aluminium oxide has been suggested in semiconductor technology in which such a layer should be given a particular pattern. In this case problems may occur also with the above mentioned known etchants because underlying parts of a different material can be attacked, for example, parts of metallic material and, in particular in the presence of fluoride ions, parts of silicon compounds, such as silicon oxide, or other silicon-containing oxides, for example, borosilicate glass or phosphosilicate glass.

One of the objects of the invention is to provide a more selective etchant for aluminium oxide. According to the invention, a method of treating bodies with an etchant for removing aluminium oxide is characterized in that the etchant used consists of a solution of a fluoride in an organic solvent, which solution is substantially free from hydrofluoric acid and unbound water.

The term "substantially free from unbound water" is to be understood to mean herein that substantially no water molecules in an unbound state are present. Included are substantially anhydrous solutions and solutions in which substantially all the water molecules are bound in some way or another to other constituents, for example the solvent. The possibility of binding to such other constituents has the additional advantage that water molecules possibly formed during the etching process can be bound immediately.

As a fluoride in the solution is preferably used ammonium fluoride. Introduction of metal ions from the etchant and hence possible surface impurity can be counteracted by it. In particular, the presence of such metal ions may have a contaminating effect on a semiconductor device to be manufactured. In particular, alkali ions, for example sodium ions, may cause instabilities in silicon oxide-covered semiconductor devices.

Organic solvents may be chosen, for example, from the alcohols, in particular multivalent alcohols. Suitable solvents from this group are ethylene glycol and glycerine.

Another suitable solvent is glacial acetic acid. Acetic acid is a weaker acid then hydrofluoric acid, so that, for example, when dissolving ammonium fluoride in glacial acetic acid, substantially no hydrofluoric acid can be formed.

It is to be noted that etchants with hydrofluoric acid in an organic solvent, for example, ethylene glycol, glycerine or methanol, are known per se for etching glass layers on the basis of silicon oxide, in particular for use in semiconductor technology, inter alia to open windows in silicon oxide layers, for example, to expose underlying metal surfaces, for example, surface parts of aluminium conductors. Another known etchant for use in the manufacture of semiconductor devices is a mixture of concentrated hydrofluoric acid, a buffer and an organic substance which can absorb water, for example, an organic acid, an alcohol, ethylene glycol or glycerine. As an example is mentioned an etchant formed by mixing approximately ⅓ kg of concentrated hydrofluoric acid, (43% by weight of HF and the remainder water), nearly 2kg of an aqueous ammonium fluoride solution (40% by weight of $NH_4F$) and 1 liter of glacial acetic acid (100% acetic acid). These etchants contain HF and may contain very much water. Thus it is likely that the etchant of the last-mentioned composition still contains much unbound water.

It has been found on the contrary that the etchants for use in the method according to the invention in which hydrofluoric acid is substantially not present, can dissolve aluminium oxide in a period of time in which silicon oxide is attached to a much smaller extent.

In order to accurately control the etching process, in particular in the manufacture of semiconductor devices, in which layers of insulation material in the order of 0.1 $\mu$m thick are usual, preferably not too high concentrations of the fluoride are used so as to obtain a reasonably controllable etching rate in etching away, at least locally, a layer of aluminium oxide, in which the attack of layers of material differing from aluminium oxide, for example of silicon oxide, can be minimized. In the case of a cleaning etching treatment of an aluminium surface, a short treatment is moreover sufficient to remove any very thin film of aluminium oxide, and that is so irrespective of the use of a concentrated or a more diluted solution of the fluoride. A more diluted solution has the advantage of an even smaller attack of materials like silicon oxide. According to a preferred embodiment, the etchant used therefore consists of a solution of at most 30 gr. of ammonium fluoride per liter of the organic solvent, in particular per liter of glacial acetic acid. In practice etchants will be preferred which do not have a too low etching rate for aluminium oxide and do not finish their etching action too soon. In the last-mentioned solution, for example, the quantity of ammonium fluoride will preferably be chosen to be not lower than 10 g per liter of the solvent.

Etching liquids to be used in the method according to the invention remove aluminium oxide many times faster than silicon oxide or other silicon oxide-containing insulation materials used in the manufacture of semiconductor devices, for example borosilicate glasses and phosphosilicate glasses. Furthermore, silicon nitride is substantially not attacked.

As already stated above, the etchants to be used according to the invention are particularly useful in the manufacture of semiconductor devices. The invention therefore also comprises a method of manufacturing semiconductor devices in which the above-mentioned treatment according to the invention is used with an etchant to remove aluminium oxide in a semiconductor material-containing body. This treatment may then be used to etch away entirely or partly a layer of $Al_2O_3$ provided on a semiconductor body, for example to obtain a given pattern of said layer, for example while using a suitable photoresist pattern. The use of a pattern of an insulating aluminium oxide layer is known per se in semiconductor devices. For example, an aluminium oxide layer together with an underlying silicon oxide layer may repel negative charge carriers and attract positive charge carriers in underlying silicon, so that surface inversion in p-type silicon is counteracted. It is also possible, by superficial oxidation of an aluminium layer, to obtain an insulating aluminium oxide layer on said layer. The aluminium layer may be formed in a given conductor pattern which connects parts of semiconductor circuit elements to other parts of circuit elements or to connection places for providing connections to external leads or to an overlying conductor pattern. For this purpose, the semiconductor body may advantageously be treated with the etchant according to the invention, in which the underlying aluminium can be exposed locally without itself being attacked to any considerable extent during the etching treatment. Instead of a photoresist, an etching mask of silicon oxide may also be used, since during the etching treatment, silicon oxide may be attacked to a small extent only.

A treatment with the etchant according to the invention can be used advantageously to superficially clean places for providing connections to an aluminium layer to obtain a readily conductive contact to conductors connected thereto, for example, conductors belonging to a second pattern in a double layer wiring, or vapour-deposited, sputtered, electroplated, or soldered conductors, or conductors provided differently for providing conductive connections of external leads to the semiconductor device.

The invention further comprises semiconductor devices in which a treatment with the etchant according to the invention is used during the manufacture.

However, the invention is not restricted to the use in semiconductor devices. Another example is an aluminium wiring provided on an insulator, to which wiring connections are to be connected, for example by soldering.

As an example is described a cleaning step in the treatment of connection places of an aluminium wiring consisting of a pattern of an aluminium layer on a substratum, for example, a wafer consisting of insulating beryllium oxide, which wiring is to be connected locally to one or more circuit components for example, semiconductor devices, such as semiconductor circuit elements and/or integrated circuits, and/or other circuit components. In particular when the substratum with the wiring has been exposed to air for some time, the exposed aluminium surface may be covered with a thin aluminium oxide film, for example in a thickness in the order of 0.01 $\mu$m. Such a thin oxide film is sufficient to present difficulties upon providing electrically conductive and mechanically readily adhering connections. Substratum and wiring are then dipped in an etching bath for aluminium oxide consisting of a solution of 15 g of ammonium fluoride per liter of glacial acetic acid. The temperature of the bath is chosen between 20° C and 30° C. After a treatment of 1 minute any formed thin aluminium oxide skin will be sufficiently removed. The wafer is then rinsed with deionized water and rapidly dried by means of a current of dry air, for example for a few seconds. The aluminium surface is then sufficiently clean of aluminium oxide. Within the next hour, readily adhering connections can be provided on the aluminium surface, for example, by soldering or thermocompression bonding, for example with aluminium wire of which at least an end portion has been treated in the same etching bath. Without such an etching treatment, such an aluminium connection could be obtained in known manner by ultrasonic welding, but such a welding process is rather complicated and may furthermore give rise to mechanical damage.

The connection of electric leads to an aluminium wiring has also been used successfully in the manufacture of semiconductor devices in which on one side of a semiconductor body of silicon one or more semiconductor circuit elements are formed in which the semiconductor surface on said side is provided with an insulating layer of silicon dioxide, possibly partly converted into borosilicate glass and/or phosphosilicate glass, in which insulating layer contact windows are provided. An aluminium layer in the form of a conductor pattern is then provided on the insulating layer and in the windows in known manner, in which the windows contacts are formed with underlying semiconductor parts and in which the pattern parts present on the insulator constitute conductive connections between said contacts mutually or with contact places also formed by parts of the aluminium layer which are present on the insulating layer, which connection places serve for the connection to external leads of the semiconductor device or to a subsequent laminated wiring pattern in a system with so-called double layer wiring. The aluminium may have been given a small content of silicon in known manner.

Prior to contacting leads to the connection places, the aluminium surface of said connection places is cleaned according to an embodiment of the method of the invention with an etchant for aluminum oxide consisting of a solution of between 10 and 30 g, for example 15 to 20g, of ammonium fluoride in glacial acetic acid for 1 minute, followed by a rinsing treatment as described above. The aluminium surface is then sufficiently clean to obtain good connections to conductors to be provided on the connection places in the manner as described above, provided the cleaned surface has meanwhile not been exposed to moist air for too long a period of time. During the short action of the etchant, possibly exposed parts of the insulating layer and of the aluminium layer to be cleaned are substantially not attached, nor in the case of using aluminium having a small content of silicon due to which the aluminium may generally be attached more easily by known etchants for aluminium oxide than pure aluminium. In the embodiment described, a possibly exposed aluminium surface which is provided in the windows and forms an ohmic contact with the underlying silicon is not attacked substantially either by the etchant. An insulating layer may previously be provided on the aluminium pattern, for example, by providing silicon oxide in known manner and etching windows in the connection places, for example, by using a photoresist mask and an etching liquid usual for silicon oxide and consisting of a mixture of concentrated hydrofluoric acid and a concentrated aqueous solution of ammonium fluoride. The cleaning treatment with ammonium fluoride in glacial acetic acid may be carried out later-on when the desired connections are to be provided, or when a double layer wiring is to be formed, for example, by means of a second aluminium layer.

It is also possible to protect the first provided aluminium wiring with a dense aluminium oxide layer. In such an embodiment, said layer is obtained in a thickness of 0.1 μm on a layer of aluminium containing a little silicon and having an original thickness of 0.8 μm, by a usual anodic oxidation in an electrolyte bath consisting of a solution of tartaric acid and/or ammonium tartrate at 25° C for 1-5 minutes at a voltage of 80 Volt. The surface with the thus covered aluminium pattern is further covered with a silicon oxide layer, as a substratum for a second wiring layer. For making contact between the two wirings, windows are etched in the silicon oxide layer at the area of windows, as described above. The aluminium oxide layer is not etched through. Preceding the provision of the aluminium layer for the second wiring, the aluminium oxide layer at the area of the windows should be removed in behalf of the exposure of the underlying aluminium. For this purpose, an etchant in agreement with the invention is used, by way of example, a solution of 20g of ammonium fluoride per liter of glacial acetic acid at 20° C. After approximately 7 minutes, the dense aluminium oxide in the windows has disappeared and a clean aluminium surface has been exposed. After rinsing and drying, the second aluminium layer is provided in a thickness of 1.2 μm by vapour-deposition in a vacuum, a good contact between the two aluminium layers being obtained at the area of the windows in the intermediate silicon oxide layer. The second Al-layer is then formed in the desired pattern having connection pads for providing connections to the semiconductor device. Preceding the provision of said connections, again a treatment with an etchant for aluminium oxide according to the invention is used.

The preceding embodiments have been given by way of example, but many other embodiments are possible without departing from the scope of this invention, both as regards the composition of etchants for aluminium oxide and other applications.

Since the invention relates to the manufacture of semiconductor devices, the invention is further not restricted to the application of silicon as a semiconductor material, but also includes the use of other semiconductor materials, for example, germanium, semiconductors of the $A^{III}B^{V}$-type and semiconductors of the $A^{II}B^{VI}$-type.

What is claimed is

1. An etchant for preferentially removing aluminium oxide from bodies, consisting essentially of a non-aqueous solution of ammonium fluoride in organic solvent, the solution being essentially free of hydrofluoric acid and unbound water.

2. An etchant as defined in claim 1 wherein the organic solvent is ethylene glycol.

3. An etchant as defined in claim 1 wherein the organic solvent is glycerol.

4. An etchant as defined in claim 1 wherein the organic solvent is glacial acetic acid.

5. An etchant as defined in claim 4 wherein the solution contains no more than 30G of ammonium fluoride per liter of glacial acetic acid.

6. An etchant as defined in claim 5 wherein the solution contains at least 10g of ammonium fluoride per liter of glacial acetic acid.

7. A method of preferentially removing aluminium oxide from a surface of a body comprising the step of etching the surface of the body with a non-aqueous solution consisting of an ammonium fluoride in organic solvent, the solution being essentially free of hydrofluoric acid and unbound water.

8. A method as defined in claim 7 wherein the organic solvent is ethylene glycol.

9. A method as defined in claim 7 wherein the organic solvent is glycerol.

10. A method as defined in claim 7 wherein the organic solvent is glacial acetic acid.

11. A method as defined in claim 10 wherein the solution contains no more than 30g of ammonium fluoride per liter of glacial acetic acid.

12. A method as defined in claim 11 wherein the solution contains at least 10g of ammonium fluoride per liter of glacial acetic acid.

* * * * *

UNITED STATES PATENT OFFICE
CERTIFICATE OF CORRECTION

Patent No. 4,087,367                    Dated May 2, 1978

Inventor(s) Jean-Pierre Rioult et al.

It is certified that error appears in the above-identified patent and that said Letters Patent are hereby corrected as shown below:

Column 1, line 19, "exposed in" should read -- exposed to --.

Column 2, line 50, "attached" should read -- attacked --.

Column 5, line 1, "attached" should read -- attacked --.

Column 5, line 3, "attached" should read -- attacked --.

Claim 7, line 4, "of an ammonium fluoride" should read

-- of ammonium fluoride --.

Signed and Sealed this

Seventeenth Day of October 1978

[SEAL]

Attest:

RUTH C. MASON
*Attesting Officer*

DONALD W. BANNER
*Commissioner of Patents and Trademarks*